United States Patent [19]

Kumashiro

[11] Patent Number: 5,677,846

[45] Date of Patent: Oct. 14, 1997

[54] DEVICE SIMULATOR AND MESH GENERATING METHOD THEREOF

[75] Inventor: Shigetaka Kumashiro, Tokyo, Japan

[73] Assignee: NEC Corporation, Tokyo, Japan

[21] Appl. No.: 355,222

[22] Filed: Dec. 9, 1994

[30] Foreign Application Priority Data

Dec. 13, 1993 [JP] Japan .................. 5-311392
Dec. 16, 1993 [JP] Japan .................. 5-316148

[51] Int. Cl.$^6$ ..................... G06F 17/50; G06T 17/20
[52] U.S. Cl. ............... 364/488; 364/489; 364/490; 364/491; 364/578; 395/125
[58] Field of Search .................. 364/488, 490, 364/491, 578, 489; 395/125, 608; 136/89 CC; 257/584, 370, 503, 687; 437/20, 95; 326/113; 62/376

[56] References Cited

U.S. PATENT DOCUMENTS

| | | | |
|---|---|---|---|
| 4,151,005 | 4/1979 | Strebkov et al. | 136/89 CC |
| 4,969,116 | 11/1990 | Wada et al. | 364/578 |
| 5,257,346 | 10/1993 | Hanson | 395/125 |
| 5,367,465 | 11/1994 | Tazawa et al. | 364/468 |

OTHER PUBLICATIONS

Yixin et al., "Advanced Two Dimensional Automatic Triangular Mesh Generation for DE2D Interface Software Package", Jan. 88, IEEE Transactions on Magnetics, vol. 24, No. 1, pp. 318–321.

Selberherr, "Analysis and Simulation of Semiconductor Devices", Chapter 6: The Discretization of the Basic Semiconductor Equations, Springer–Verlag, pp. 149–201.

Rafferty et al., "Iterative Methods in Semiconductor Device Simulation", IEEE Transactions on Electron Devices, vol. ED–32, No. 10, p. 2018 Oct. 1985.

Coughran, Jr. et al., "Adaptive Grid Generation for VLSI Device Simulation", IEEE Transactions on Computer–Aided Design, vol. 10, No. 10, p. 1263 Oct. 1991.

P. Conti et al.; "Ω—An Octree–Based Mixed Element Grid Allocator for the Simulation of Complex 3–D Device Structures"; IEEE Transactions on Computer–Aided Design, vol. 10, No. 10, Oct. 1991, pp. 1231–1241.

Primary Examiner—Kevin J. Teska
Assistant Examiner—Phallaka Kik
Attorney, Agent, or Firm—Whitham, Curtis, Whitham & McGinn

[57] ABSTRACT

A device simulator including a boundary protection layer generation portion for generating a boundary protection layer which will not cause parasitic resistance in the vicinity of a boundary between different components of a semiconductor device whose electric characteristics is to be simulated, a mesh point generation portion for allocating a mesh point apart from the boundary protection layer by a predetermined reference distance, and a mesh generation portion for generating a triangular mesh by connecting the mesh point.

9 Claims, 19 Drawing Sheets

FIG.21
(PRIOR ART)
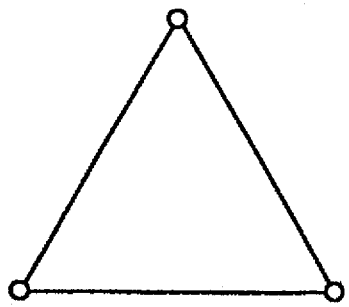
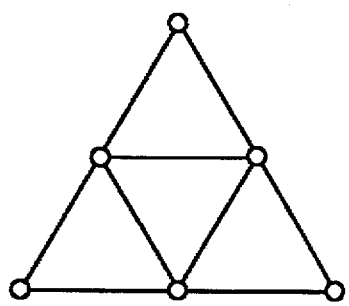
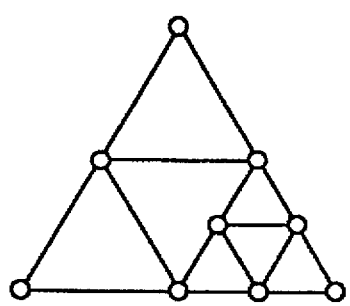

DEVICE SIMULATOR AND MESH GENERATING METHOD THEREOF

BACKGROUND OF THE INVENTION

1. Field of the Invention

The present invention relates to a method of generating meshes, which are partitions for dividing a semiconductor device into small areas, and a device simulator for implementing the mesh generating method in semiconductor device simulation techniques.

2. Description of the Related Art

Simulation by device simulators is used as a means of computing physical quantities within a semiconductor transistor by a computer to calculate such electric characteristics of the transistor as a terminal current and a threshold voltage. In making optimization design of transistors so that a semiconductor device will exhibit best electric characteristics, simulation by using a device simulator enables drastic reduction of both costs and time required for the development and design of the semiconductor device as compared with actual test of the same. In addition, it is possible through simulation by a device simulator to examine behavior of electrons and holes in a semiconductor in detail by computing physical quantities within a semiconductor transistor. Such examination leads to analysis of causes of impact ionization phenomenon, one of the problems of a miniaturized MOSFET.

In device simulation, partial differential equations such as the Poisson equation expressing a relationship between a potential and a carrier concentration and a current continuity equation are solved in order to obtain physical quantities within a semiconductor transistor. One of the solutions of a partial differential equation is to divide a semiconductor device into small areas and discretize a partial differential equation, which is recited in, for example, S. Selberherr, "Analysis and Simulation of Semiconductor Device" (Springer-Verlag), pp. 149–201.

Selberherr recites in the article a method of discretizing a two-dimensional cross section of a semiconductor by providing meshes on a semiconductor transistor to divide it into small areas and defining a current at each partition line (mesh branch) between cross over points (mesh points) forming a mesh. A specific example of discretization of a bipolar transistor by using orthogonal meshes is shown in FIG. 17. FIG. 18 is a diagram conceptually illustrating a state of the vicinity of one mesh point. In the discretization using orthogonal meshes, each mesh point connects with its four neighboring mesh points by mesh branches as shown in the figure. A current between mesh points, which defines a current density on each mesh branch, is calculated by integrating the current density over a vertical section of a current path corresponding to each mesh branch. A vertical section of a current path can be obtained by finding a vertical bisector of each mesh branch.

The above-described division of a semiconductor device by orthogonal meshes, however, has difficulty in precisely representing a semiconductor device of oblique configuration because its oblique configuration should be approximated in step-form. One solution to this problem is the method recited in C. S. Rafferty et al., "Iterative Methods in Semiconductor Device Simulation" (IEEE Transaction on Electron Devices, vol. ED-32, pp. 2018–2027, 1985). The article recites the method of dividing the configuration of a semiconductor device into small areas by using triangles for discretization. A specific example of discretization of a trench isolated CMOS by using triangular elements is shown in FIG. 19. As illustrated in FIG. 19, triangular elements can precisely represent the trench structure. A current and an integration method thereof when using a triangular element are illustrated in FIG. 20. Similarly to the above-described case of orthogonal meshes, a current between mesh points is calculated by defining a current density over each mesh branch and integrating the current density over a vertical section of a current path corresponding to each mesh branch. A vertical section of a current path is obtained by finding a perpendicular from a circumcenter of a triangle to each mesh branch.

As mentioned in the foregoing, because of being highly adaptive to any configuration, triangular meshes are used in conventional device simulation to divide a semiconductor device. The triangular mesh generation method, however, has a drawback when used in simulation of MOSFETs.

That is, because a carrier concentration rapidly decreases in an inversion layer of an MOSFET proportionally to a distance from an Si—SiO$_2$ interface, a large part of an inversion layer current will flow through mesh branches on the Si—SiO$_2$ interface. Supposing, for example, a line segment P$_1$–P$_2$ of FIG. 20 to be an Si—SiO$_2$ interface, most of the inversion layer current will pass thorough a section $d_{12}$. In this case, when triangles aligned along the Si—SiO$_2$ interface have various shapes and some of them have extremely short $d_{12}$, the inversion layer current will be squeezed at $d_{12}$ to be subjected to large resistance. A current detouring around P$_1$–P$_3$–P$_2$ also meets with resistance because a potential at P$_3$ acts toward a direction to push back carriers stored in the inversion layer. These phenomena are referred to as parasitic resistance effects.

Conventional simulation by a device simulator has a disadvantage in that its precision is considerably decreased due to the parasitic resistance effect causing reduction of an overall inversion layer current.

In general, the precision of a simulation by a device simulator is largely dependent on partition of meshes, and it can be improved as the number of divisions increases by subdividing the meshes. On the other hand, the computation time required for simulation increases non-linearly with the number of meshes. For effective simulation, it is therefore necessary to minimize the number of mesh points and generate such meshes as achieving high computation precision.

A conventional mesh generating method is to generate coarse initial meshes and add mesh points where refinement is necessary to subdivide mesh elements. One of such subdivision methods is recited, for example, in W. M. Coughram Jr. et al. "Adaptive Grid Generation for VLSI Device Simulation" (IEEE Transaction on Computer-Aided Design, vol. CAD-10, pp. 1259–1275, 1991). The article recites a method of subdividing a triangular element by adding mesh points on a mesh branch connecting mesh points between which a rate of a local impurity concentration change, corresponding and errors in a partial differential equation, are large. FIG. 21 schematically shows how a triangular element is subdivided.

In the conventional mesh generation method described above, however, the number of mesh points is so large that it exceeds an upper limit thereof and much more time is consumed for computation, depending on a structure of a semiconductor device.

SUMMARY OF THE INVENTION

A first object of the present invention is to provide a device simulator which can simulate an inversion layer current of an MOSFET having an Si—SiO$_2$ interface in an arbitrary direction to high precision without generating parasitic resistance caused by meshes, and a method for generating the meshes.

A second object of the present invention is to provide a device simulator which can generate meshes corresponding to a rate of a local impurity concentration change while holding meshes to a fixed number, and a method for generating such meshes.

According to one aspect of the invention, a device simulator comprises:

boundary protection layer generating means for generating a boundary protection layer which will not cause parasitic resistance in the vicinity of a boundary between different components of a semiconductor device whose electric characteristics is to be simulated by using a computer;

mesh point allocating means for allocating mesh points apart from the boundary protection layer by a predetermined reference distance; and triangular mesh generating means for generating triangular meshes by connecting the mesh points.

In the preferred construction, the boundary protection layer generating means generates a boundary protection layer including triangular meshes, each having a mesh branch parallel to said boundary.

Also, the device simulator further comprises checking means for checking whether a boundary protection layer with respect to a generated triangular mesh is destroyed or not, wherein when the checking means detects a destroyed part of a boundary protection layer, and the boundary protection layer generating means modifies the destroyed part and re-generates a boundary protection layer.

According to another aspect of the invention, a mesh generating method comprising the steps of:

generating a boundary protection layer which will not cause parasitic resistance in the vicinity of a boundary between different components of a semiconductor device whose electric characteristics is to be simulated by using a computer;

allocating mesh points apart from the boundary protection layer by a predetermined reference distance; and generating triangular meshes by connecting the mesh points.

In the above-mentioned construction, the step of generating a boundary protection layer comprises the steps of:

generating mesh points on a boundary line segment;

generating a predetermined number of mesh points, at predetermined intervals, from the mesh points generated on the boundary line segment other than those at vertexes of angles in a direction vertical to the boundary line segment;

generating a predetermined number of mesh points, at predetermined intervals, from the point located at a vertex of an angle whose internal angle is less than 180°, among those generated on the boundary line segment, in a direction of a bisector of the angle;

generating, at predetermined intervals, a predetermined number of mesh points from the mesh point located at a vertex of an angle whose internal angel is more than 180°, among those generated on the boundary line segment, in directions vertical to two boundary line segments forming the angle and a direction bisecting the angle between the two line segments by a predetermined angle; and generating an orthogonal mesh by connecting the mesh points generated in each step by mesh branches including line segments vertical and parallel to the boundary line segment.

In the above-mentioned construction, the mesh generating method comprises the steps of:

checking whether a boundary protection layer with respect to a generated triangular mesh is destroyed or not; and when a destroyed part is detected in the boundary protection layer in the step of checking whether said boundary protection layer is destroyed, modifying the destroyed part and re-generating a boundary protection layer.

According to a further aspect of the invention, a device simulator comprises:

mesh generating means for generating a triangular mesh on a semiconductor device whose electric characteristics is to be simulated by using a computer; and mesh point modifying means for modifying the position of a mesh point of the triangular mesh according to a rate of a local impurity concentration change in the semiconductor device.

In the above-mentioned construction, the mesh point modifying means shifts a mesh point to a position to satisfy static equilibrium conditions when each mesh branch of the triangular mesh is made of a spring, with a coefficient set according to a rate of a local impurity concentration change in the semiconductor device as a spring constant.

Also, the device simulator further comprises mesh re-generating means for re-generating a triangular mesh by newly connecting a mesh point whose position is modified by the mesh point modifying means.

According to a still further aspect of the invention, a mesh generating method comprises the steps of:

generating a triangular mesh on a semiconductor device whose electric characteristics is to be simulated by using a computer; and modifying the position of a mesh point of the triangular mesh according to a rate of a local impurity concentration change in the semiconductor device.

In this case, the step of modifying the position of a mesh point, the mesh point modifying means shifts a mesh point to a position to satisfy static equilibrium conditions when each mesh branch of the triangular mesh is made up of a spring, with a coefficient set according to a rate of a local impurity concentration change in the semiconductor device as a spring constant.

Also, the mesh generating method further comprises the step of re-generating a triangular mesh by newly connecting a mesh point whose position is modified in the step of modifying the position of a mesh point.

According to a still further aspect of the invention, a device simulator comprising:

a boundary protection layer generating means for generating a boundary protection layer which will not cause parasitic resistance in the vicinity of a boundary between different components of a semiconductor device whose electric characteristics is to be simulated;

mesh point allocating means for allocating a mesh point apart from the boundary protection layer by a predetermined reference distance;

triangular mesh generating means for generating a triangular mesh by connecting the mesh points; and mesh point modifying means for modifying the position of a mesh point of the triangular mesh according to a rate of a local impurity concentration change in the semiconductor device.

These and other objects, features and advantages of the present invention will become more apparent from the following detailed description of the present invention.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings:

FIG. 21 is a diagram schematically showing how a triangular element is subdivided by adding mesh points to a triangular mesh.

DESCRIPTION OF THE PREFERRED EMBODIMENTS

Preferred embodiments of the present invention will be described in detail with reference to accompanying drawings.

Figure 1:
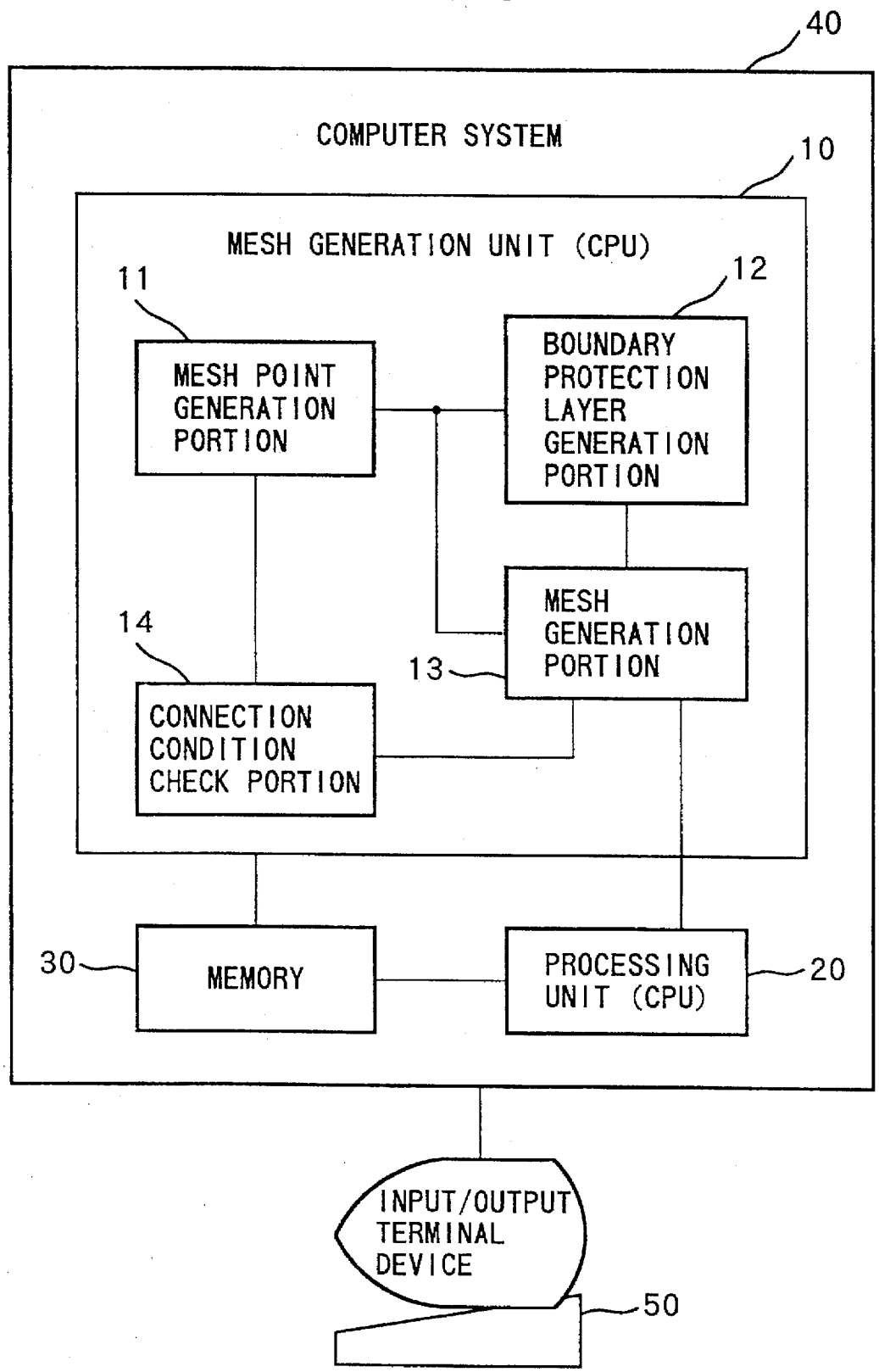
FIG. 1 is a block diagram showing an arrangement of a device simulator according to a first embodiment of the present invention.

FIG. 1 is a diagram showing an arrangement of a device simulator according to a first embodiment of the present invention.

As shown in the figure, the device simulator of the present embodiment comprises a computer system 40 including a mesh generation unit 10 for generating meshes on a semiconductor device to be simulated, a processing unit 20 for executing simulation and a memory 30 for storing processing results of each unit, and an input/output terminal device 50 for inputting various instructions and data and outputting processing results to/from the computer system 40.

The mesh generation unit 10, to be implemented by CPUs of personal computers etc., comprises a mesh point generation portion 11 for setting mesh points on a semiconductor device, a boundary protection layer generation portion 12 for generating a boundary protection layer made up of orthogonal meshes by connecting mesh points with each other, a mesh generation portion 13 for generating triangular meshes by connecting mesh points with each other and a connection condition check portion 14 for checking connection condition between mesh points.

As well as the mesh generation unit 10, the processing unit 20 is implemented by CPUs of personal computers etc. The input/output terminal device 50 is implemented by a display device such as a display and an input device such as a keyboard or a mouse.

Figure 2:
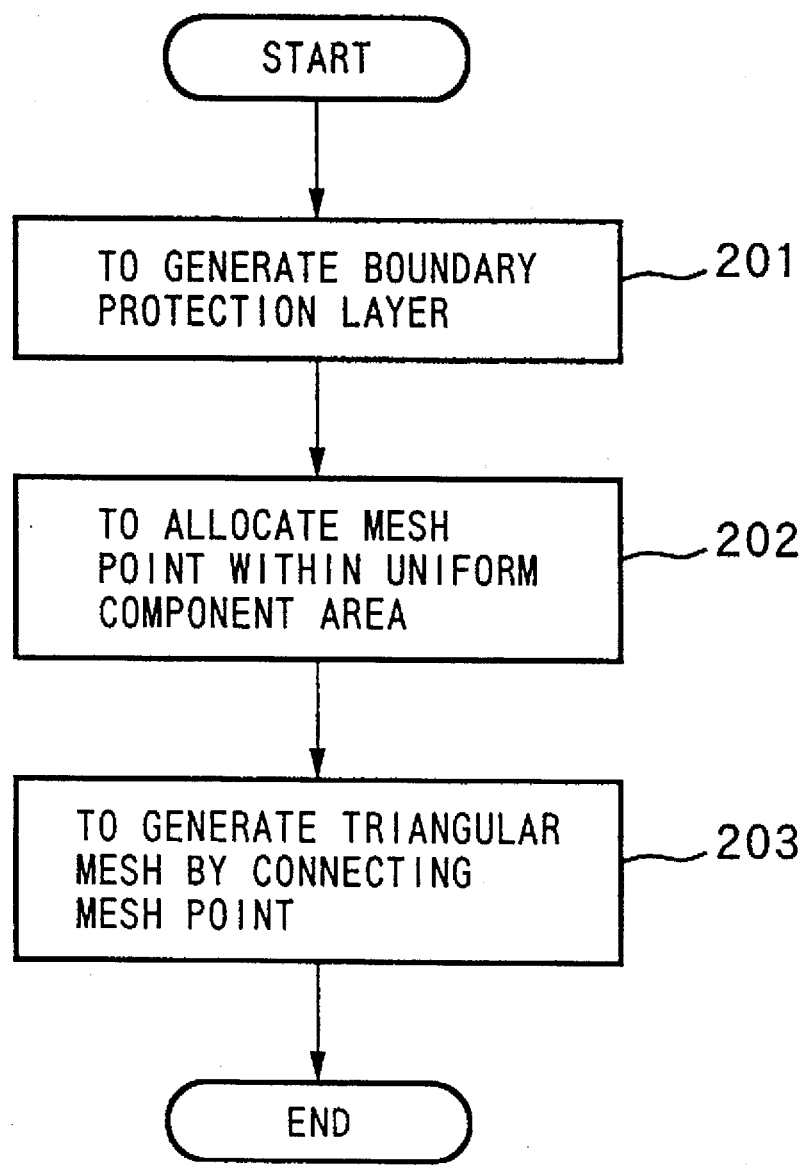
FIG. 2 is a flow chart illustrating an operation of a mesh generation unit of the embodiment.

FIG. 2 is a flow chart illustrating an operation of the mesh generation unit 10 according to the present invention.

In the mesh generation unit 10, the mesh point generation portion 11 and the boundary protection layer generation portion 12 first generate a boundary protection layer made up of locally matched orthogonal meshes along a boundary line segment, which is a boundary between two areas having uniform components different from each other in a semiconductor device to be simulated (Step 201). Then, the mesh point generation portion 11 allocates mesh points in a uniform component area apart from the boundary protection layer by more than a predetermined reference distance (Step 202). The mesh generation portion 13 then generates a triangular mesh by connecting the mesh points according to predetermined rules (Step 203).

Figure 3:
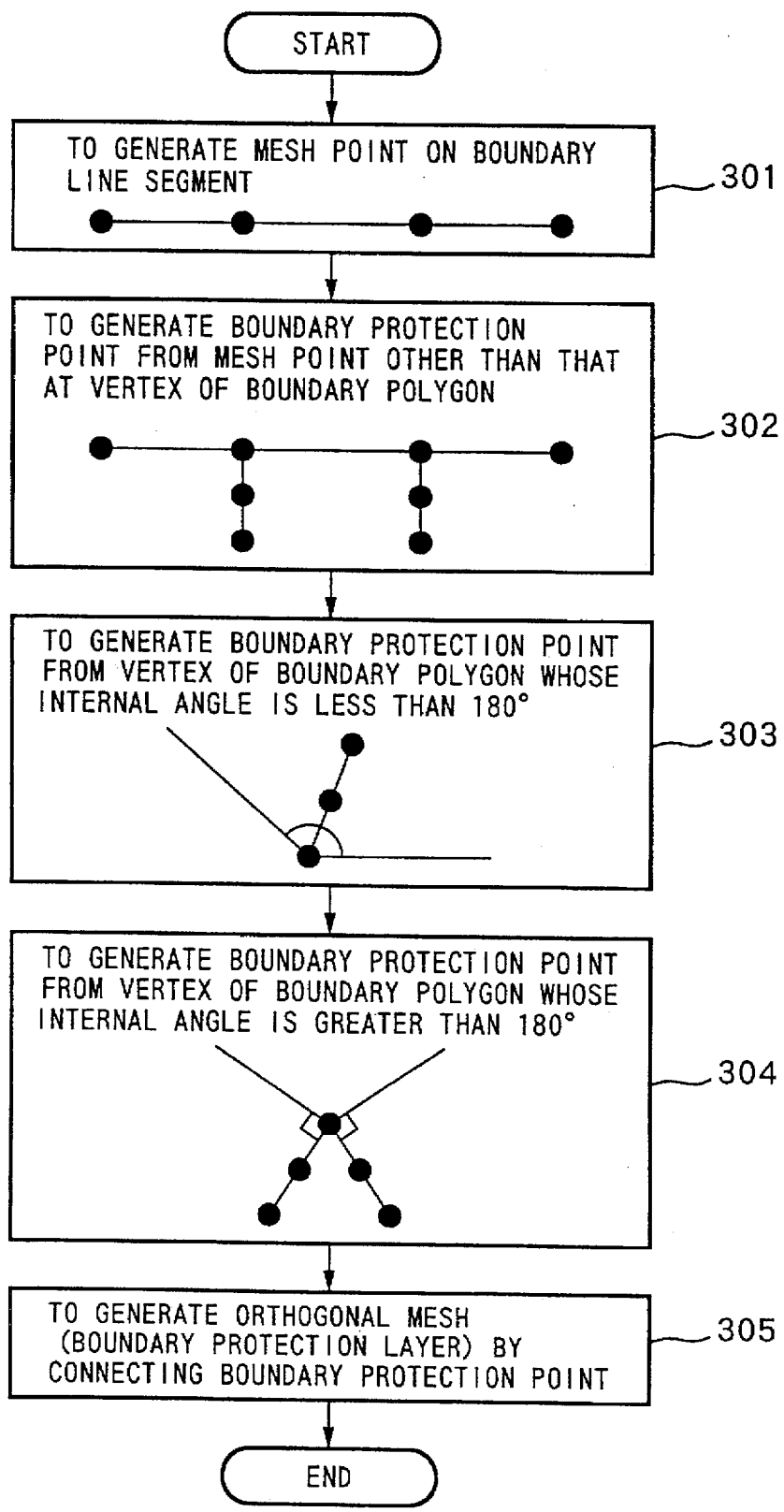
FIG. 3 is a flow chart illustrating a boundary protection layer generating operation in detail.

These operations by the mesh generation unit 10 will be described in more detail. FIG. 3 is a flow chart detailing the boundary protection layer generation operation to be executed in Step 201.

First, mesh points are allocated at predetermined intervals on a boundary line segment, which is a boundary between uniform component areas of a semiconductor device (Step 301). From mesh points allocated on the boundary line segment other than those at vertexes of angles formed by boundary line segments (vertexes of boundary polygons), perpendiculars of predetermined length are generated toward the inside of the uniform component area and a reference number of mesh points (boundary protection points) are generated at predetermined intervals on the perpendiculars (Step 302). The length of the perpendicular is determined corresponding to a width of a boundary protection layer to be generated and based on a configuration of a uniform component area and so forth. The reference number of boundary protection points is calculated based on the total number of mesh points set in consideration of computation time for simulation. Intervals of mesh points on a boundary line segment and boundary protection points can be appropriately set by taking a length of a perpendicular (a width of a boundary protection layer) and its reference number into account.

Then, among the mesh points allocated on the boundary line segment, from those located at boundary polygon vertexes whose internal angles are less than 180°, bisectors of the internal angles are generated toward the inside of the area and boundary protection points are generated by the reference number at predetermined intervals on the bisectors (Step 303). Herein, with θ representing the internal angle, the boundary protection points on the bisector in question are generated at positions 1/sin (θ/2) times the distance of the boundary protection points generated in Step 302 from their boundary protection line segment.

Then, among the mesh points allocated on the boundary line segment, from a mesh point located at a boundary polygon vertex whose internal angle is greater than 180°, perpendiculars of two boundary line segments forming the angle and a parting line which divides an angle between the perpendiculars into equal parts in the range of a predetermined reference angle are generated toward the inside of the area, then on these lines a reference number of boundary protection points are generated at predetermined intervals (Step 304). Herein, a distance from a boundary polygon vertex to each of the boundary protection points is set to be equal to a distance from each of the boundary protection points generated in Step 302 to its boundary protection line. In addition, a reference angle for dividing an angle between two perpendiculars can be arbitrarily provided. For example, with a reference angle of 30°, parting lines are provided as follows.

When an angle α between two perpendiculars (0°≦α<180°, by the definition of two perpendiculars) is α<30°, no parting line is provided.

When 30°≦α<60°, one parting line is provided for bisecting the angle between two perpendiculars.

When 60°≦α<90°, two parting lines are provided to divide the angle into three equal parts.

When 90°≦α<120°, three parting lines are provided to divide the angle into four equal parts.

When 120°≦α<150°, four parting lines are provided to divide the angle into five equal parts.

When 150°≦α<180°, five parting lines are provided to divide the angle into six equal parts.

Lastly, the mesh points generated in the above-described steps are connected by mesh branches composed of line segments parallel to each boundary line segment to generate orthogonal meshes (Step 305).

When in generating boundary protection layers, overlap of boundary protection layers can be avoided by setting a width ι of a boundary protection layer to satisfy the following equation:

$$\delta < \min[d_{min}/2, \gamma \tan(\phi_{min}/2)]$$

where $\phi_{min}$ is the smallest internal angle among those formed by boundary line segments, $d_{min}$ is a thickness of the thickest part of a uniform component area, γ is a minimum distance between mesh points on a boundary line segment and δ is a width of a boundary protection layer.

In Step 202 of FIG. 2, mesh points which form meshes are allocated in a uniform component area of a semiconductor device. As described in the foregoing, since the mesh points are allocated in an area apart from a boundary protection layer by more than a predetermined reference distance, none of the mesh points in the area will be allocated in the boundary protection layer. Herein, a reference distance is determined based on a width of a boundary protection layer, the number of layers, a configuration of a uniform component area, etc.

In Step 203, triangular meshes are generated by connecting the mesh points allocated on the semiconductor device in Steps 201 and 202 by mesh branches. As a triangular mesh generating technique, commonly owned co-pending U.S. patent application Ser. No. 08/306,970 is herein incorporated by reference. Triangular meshes are also generated to overlap orthogonal meshes constituting a boundary protection layer generated in Step 201 (meshes of right angled triangles created by dividing rectangular meshes into two equal parts). As a result, the semiconductor device is apparently covered by triangular meshes. In the boundary protection layer, a combination of right angled triangles preserving characteristics of orthogonal meshes, forms a straight current path.

Figure 4:
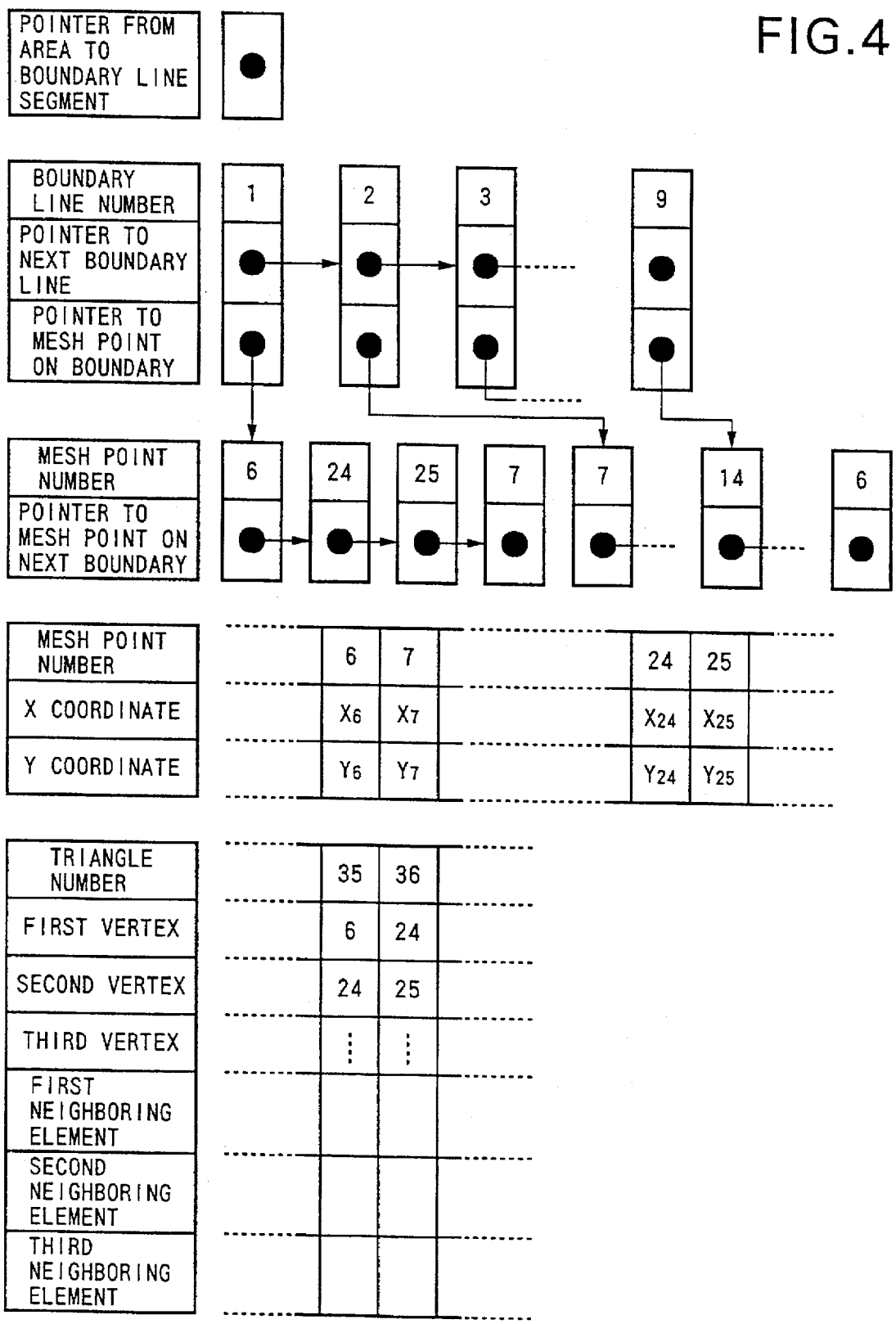
FIG. 4 is a diagram showing a data structure for implementing the embodiment.

FIG. 4 is a diagram showing one example of a data structure for implementing the mesh generation method according to the present embodiment by using a computer. Data necessary for the generation of a boundary protection layer carried out in Step 201 and shown in FIG. 3 are lists of boundary line segments surrounding a uniform component area and mesh points generated thereon. Boundary line segments in the list are sequentially connected by a pointer in a circulating manner, with a uniform component area surrounded by the boundary line segments on the left. Each boundary line segment has a line segment number and a pointer for a group of mesh points thereon. Mesh points on a boundary line segment are sequentially connected by a pointer from the starting point toward the end point of the boundary line segment and unitarily controlled in an array. After triangular elements are formed by connecting mesh points by mesh branches, created are an array of constituent mesh points of triangular elements which uses triangular element numbers provided for the distinction of the respective triangular elements as a key and an array of adjacent triangular elements.

With reference to FIG. 4, a specific example of these data will be described. It is assumed, for example, that a uniform component area over which meshes are to be laid is surrounded by nine boundary line segments denoted as the boundary line numbers 1 to 9, as shown in FIG. 4. A boundary line segment [1] starts at a mesh point [6] and ends at a mesh point [7] and two mesh points [24] and [25] are placed therebetween. Similarly, a boundary line segment [2] starts at the mesh point [7] and a last boundary line segment ends at the mesh point [6]. In addition, coordinates of the mesh point [6] are (X6, Y6) and the mesh points [6] and [24] form a triangular element 35 jointly with other point, as shown in FIG. 4.

Figure 6:
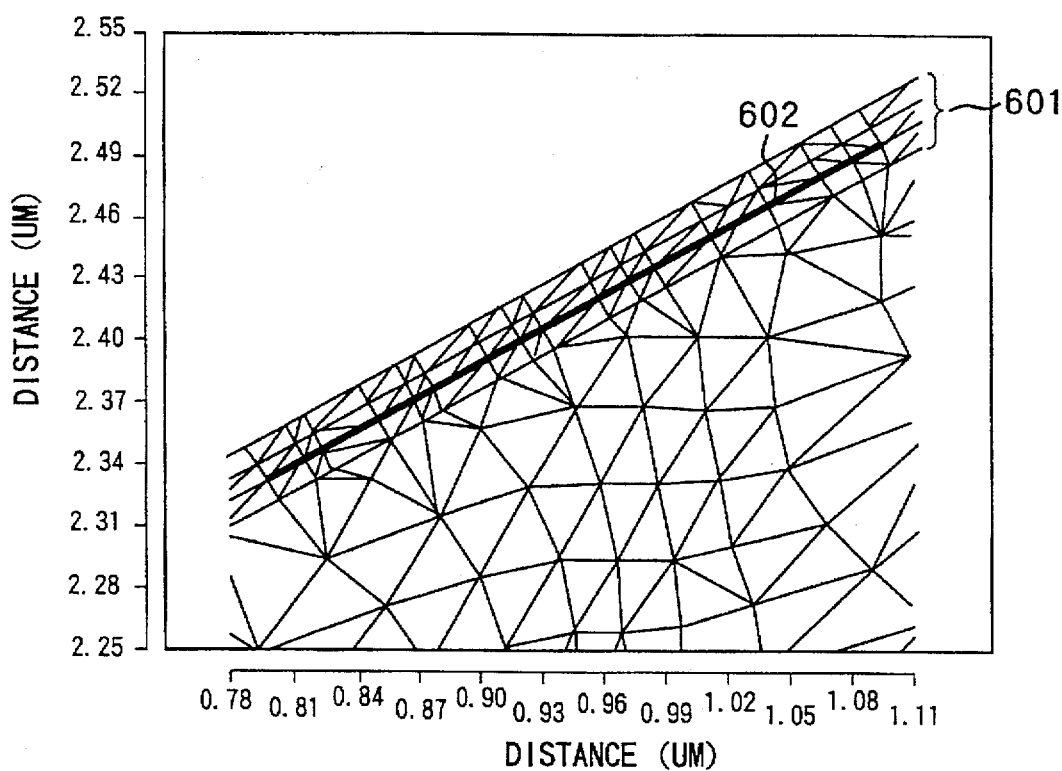
FIG. 6 is a diagram showing a state of meshes generated on a semiconductor device to be simulated by applying the present invention.
Figure 7:
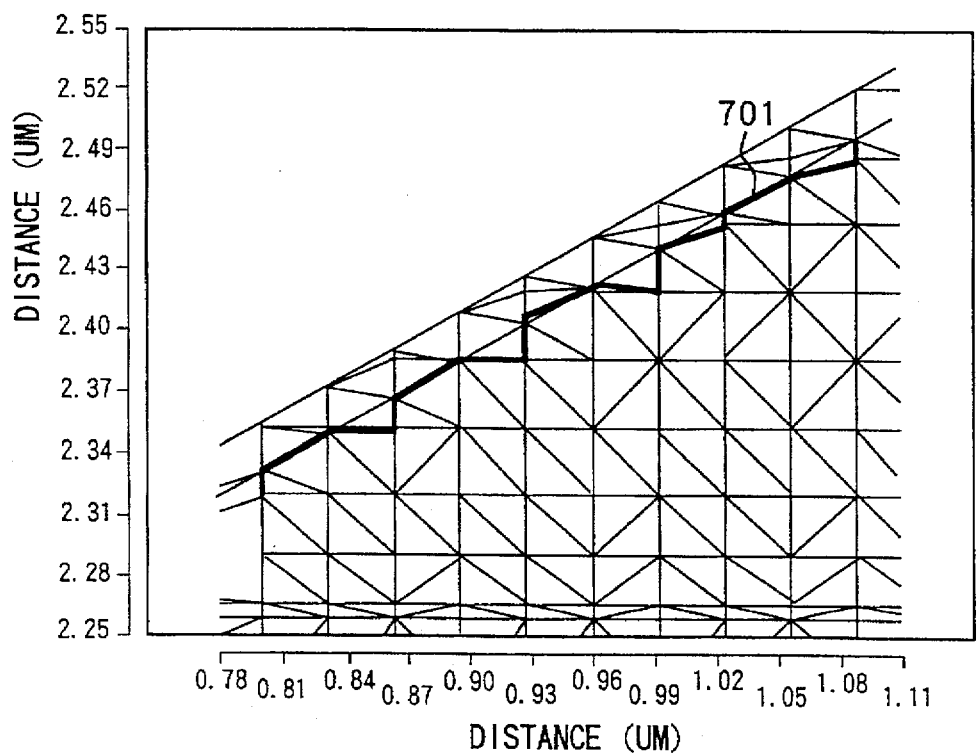
FIG. 7 is a diagram showing a state of meshes generated on a semiconductor device to be simulated without applying the present invention.

With reference to FIGS. 6 and 7, comparison will be made between triangular mesh generation states according to the present embodiment and without applying the same. Illustrated in the figures are examples of meshes generated in a part including an Si—SiO$_2$ interface extending from lower left to upper right.

FIG. 6 is a diagram showing a state of meshes generated on a semiconductor device according to the present embodiment. As illustrated in the figure, a boundary protection layer 601 is formed in the vicinity of the Si—SiO$_2$ interface. Although the boundary protection layer 601 is made up of triangular meshes as described above, their mesh branches are linearly aligned like orthogonal meshes. As a result, a uniform inversion layer current pass sectional area is obtained along the Si—SiO$_2$ interface to have a linear current path 602 identical to the Si—SiO$_2$ interface as represented by a thick line in the figure. On the other hand, FIG. 7 is a diagram showing meshes generated on the semiconductor device without applying the present embodiment. As can be seen from the figure, triangular meshes are generated in the vicinity of the Si—SiO$_2$ interface and no boundary protection layer is formed as well as in other parts. As a result, some of triangular elements have extremely small sectional areas through which inversion layer currents pass to form a zigzag main current path 701 partly apart from the Si—SiO$_2$ interface as represented by a thick line.

Figure 8:
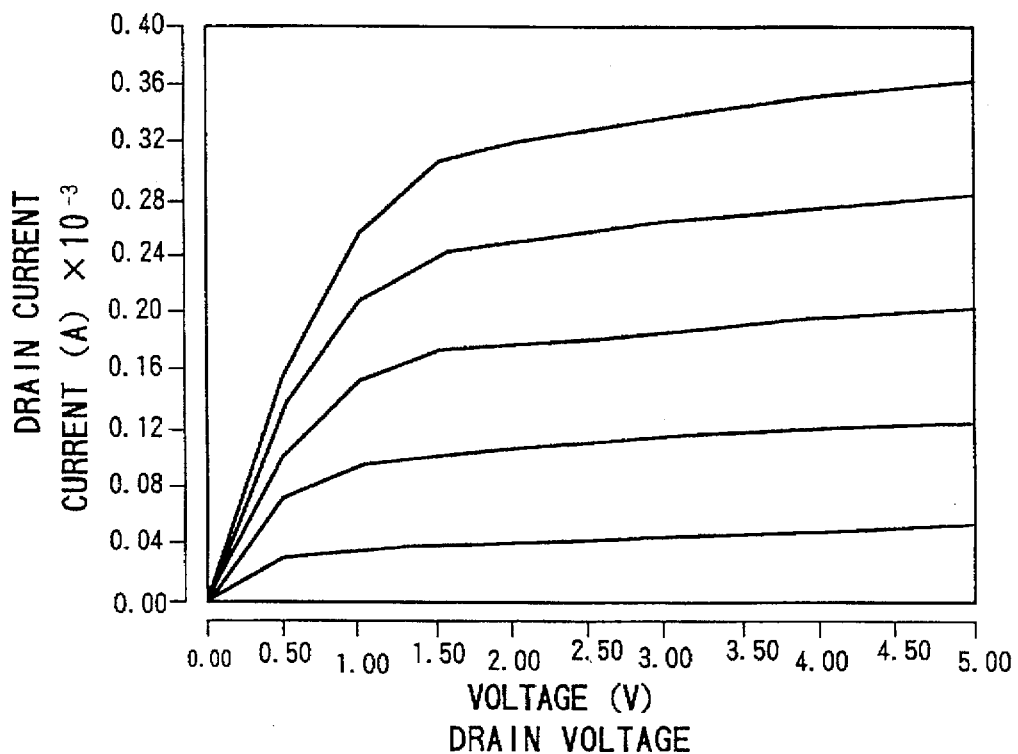
FIG. 8 is a diagram showing results of a simulation executed by generating meshes by applying the present invention.
Figure 9:
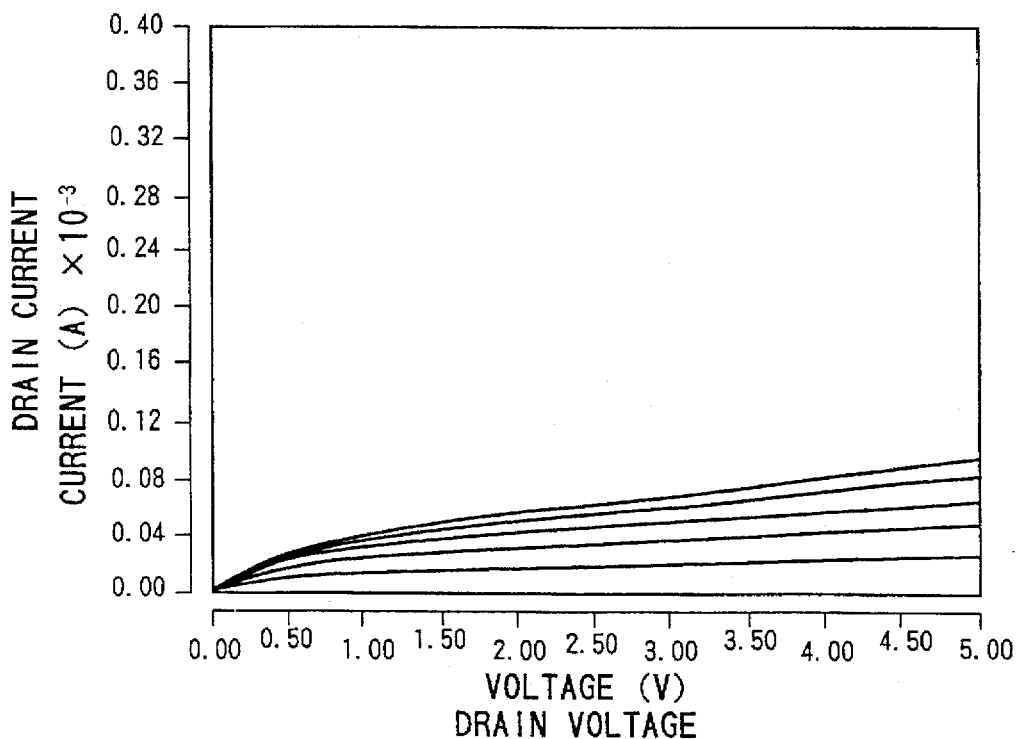
FIG. 9 is a diagram showing results of a simulation executed by generating meshes without applying the present invention.

FIGS. 8 and 9 show results of a simulation of drain current-drain voltage characteristics of a MOSFET having an oblique channel executed by using the meshes shown in FIG. 6 and 7, respectively. With reference to FIG. 9, which shows a result of simulation by using the meshes of FIG. 7 without applying the present embodiment, it can be found that only a small amount of current flows due to parasitic resistance effects attributable to a shape of the meshes. On the other hand, it can be seen from FIG. 8 showing the simulation results using the meshes of FIG. 6 according to the present embodiment that a large enough current value is obtained.

Figure 5:
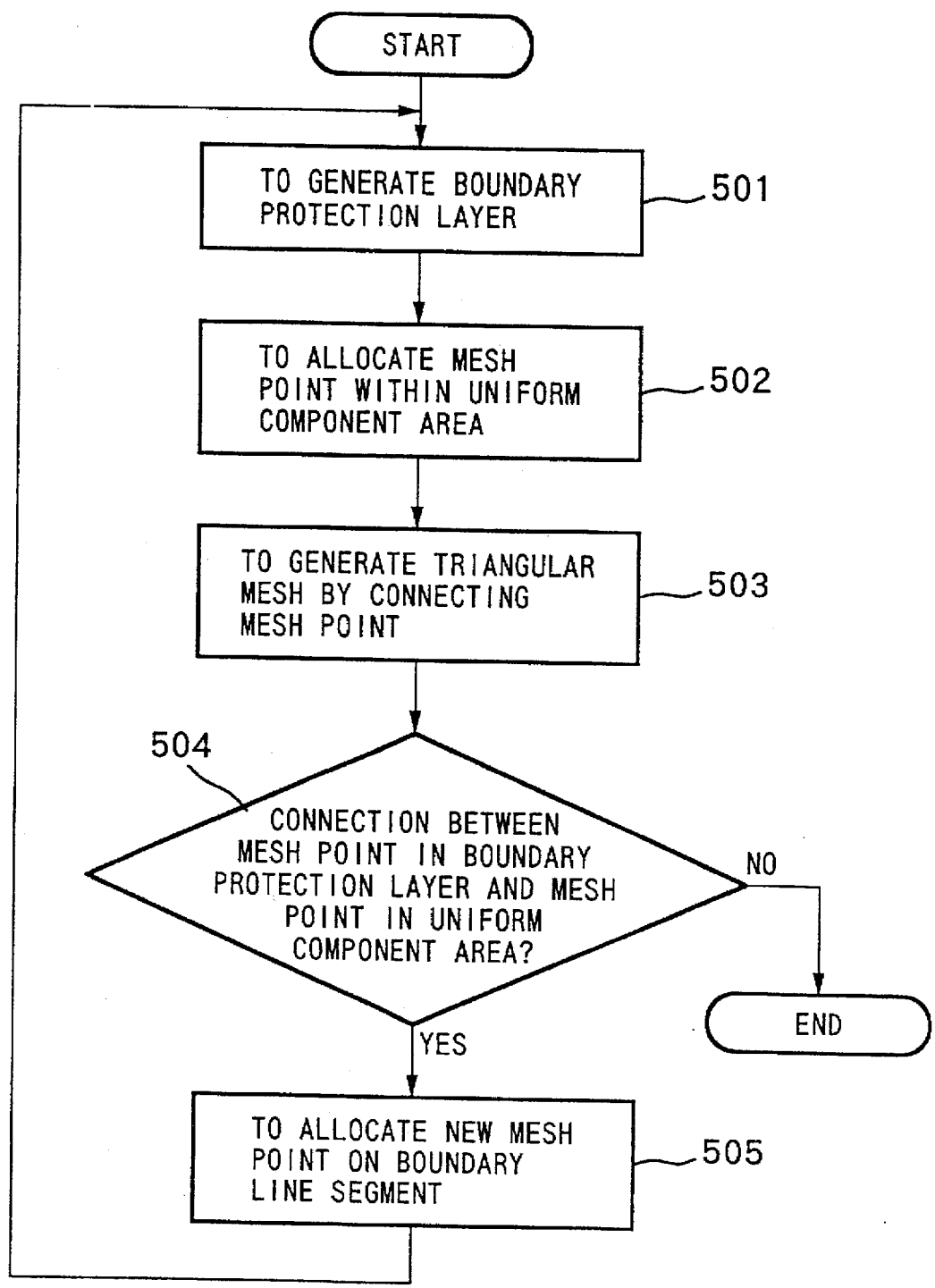
FIG. 5 is a flow chart illustrating an operation of a mesh generation unit of a device simulator according to a second embodiment of the present invention.

FIG. 5 is a flow chart showing an operation of the mesh generation unit 10 according to a second embodiment of present invention.

In FIG. 5, generation of a boundary protection layer on the boundary between uniform component areas of a semiconductor device to be simulated (Step 501), allocation of mesh points within the uniform component area (Step 502) and generation of triangular meshes by connecting the mesh points (Step 503) are the same as those of Steps 201 to 203 shown in FIG. 2.

In this embodiment, after generating triangular meshes in Step 503, the connection condition check portion 14 determines whether connection is established by a mesh branch between a mesh point allocated within the boundary protection layer in Step 501 and a mesh point allocated within the uniform component area in Step 502 (Step 504). At the time of generating triangular meshes by connecting mesh points, mesh points within the boundary protection layer and mesh points in the uniform component area are connected in some algorithms in order to generate more appropriate triangular elements. In such a case, the boundary protection layer is destroyed and is thus unable to fully prevent parasitic resistance effects. It is therefore necessary to eliminate such connection.

When a connection is made between a mesh point in the boundary protection layer and a mesh point in the uniform component area, the mesh point generation portion 11 projects the connected mesh point in the uniform component area on the boundary line segment and adds the projection point to the mesh points on the boundary line segment (Step 505) to execute processing over again, starting from the generation of a boundary protection layer. The same processing will be repeated in this manner until no further projection point is generated.

The present embodiment is particularly effective to prevent destruction of a boundary protection layer when creating triangular elements by connecting most appropriately located mesh points regardless of their positions in a boundary protection layer and a uniform component area based on the Delaunay division recited, for example, on page 1233 of P. Conti et al., "Ω-An Octree-Based Mixed Simulation Grid Allocator for the Simulation of Complex Structures" (IEEE Transaction on Computer-Aided Design, vol. CAD10, pp. 1231–1241, 1991).

As described in the foregoing, the present invention has an advantage that an inversion layer current of an MOSFET having an Si—SiO$_2$ interface of arbitrary direction can be simulated to a high precision by forming a boundary protection layer without generating parasitic resistance caused by meshes.

Figure 10:
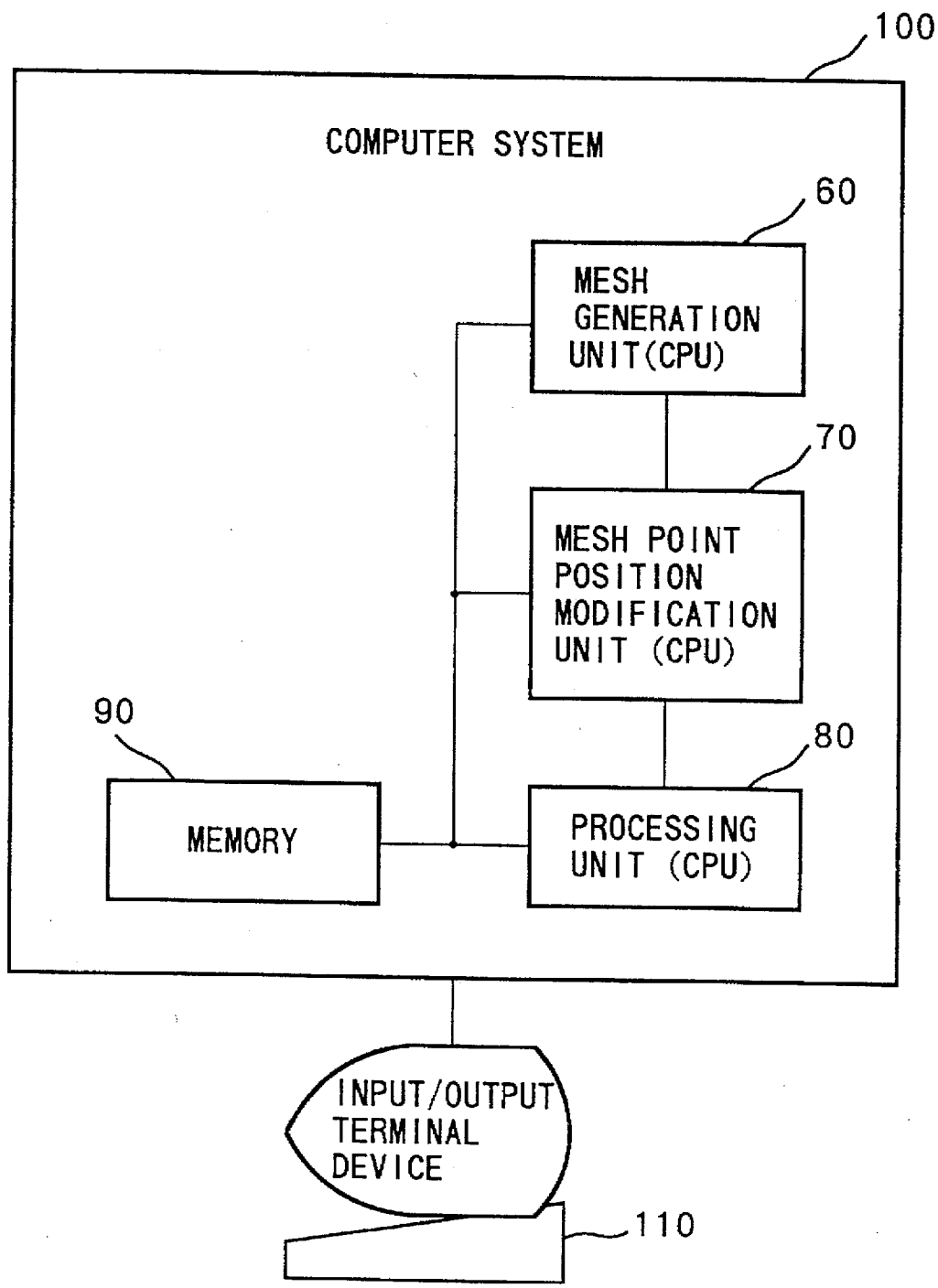
FIG. 10 is a block diagram showing an arrangement of a device simulator according to a third embodiment of the present invention.

FIG. 10 is a block diagram showing an arrangement of a device simulator according to a third embodiment.

As shown in the figure, the device simulator of the present embodiment comprises a computer system 100 including a mesh generation unit 60 for generating meshes on a semiconductor device to be simulated, a mesh point position modification unit 70 for modifying the position of a mesh point to change a shape of a mesh, a processing unit 80 for executing simulation and a memory 90 for storing operation programs for controlling the operation of each unit and processing results of the respective units, and an input/output terminal device 110.

The mesh generation unit 60, to be implemented by CPUs of personal computers etc., generates triangular meshes on a semiconductor device to be simulated. The triangular mesh generation method is the same as those described in the first and second embodiments.

The mesh point position modification unit 70, to be implemented by CPUs of personal computers etc. similarly to the mesh generation unit 60, modifies the position of mesh points constituting a triangular mesh generated by the mesh generation unit 60 to make the triangular mesh more appropriate.

The processing unit 80, as well as the mesh generation unit 60 and the mesh point position modification unit 70, is to be implemented by CPUs of personal computers and so forth. The input/output terminal device 110 is to be implemented by a display device such as a display and an input device such as a keyboard or a mouse.

Figure 11:
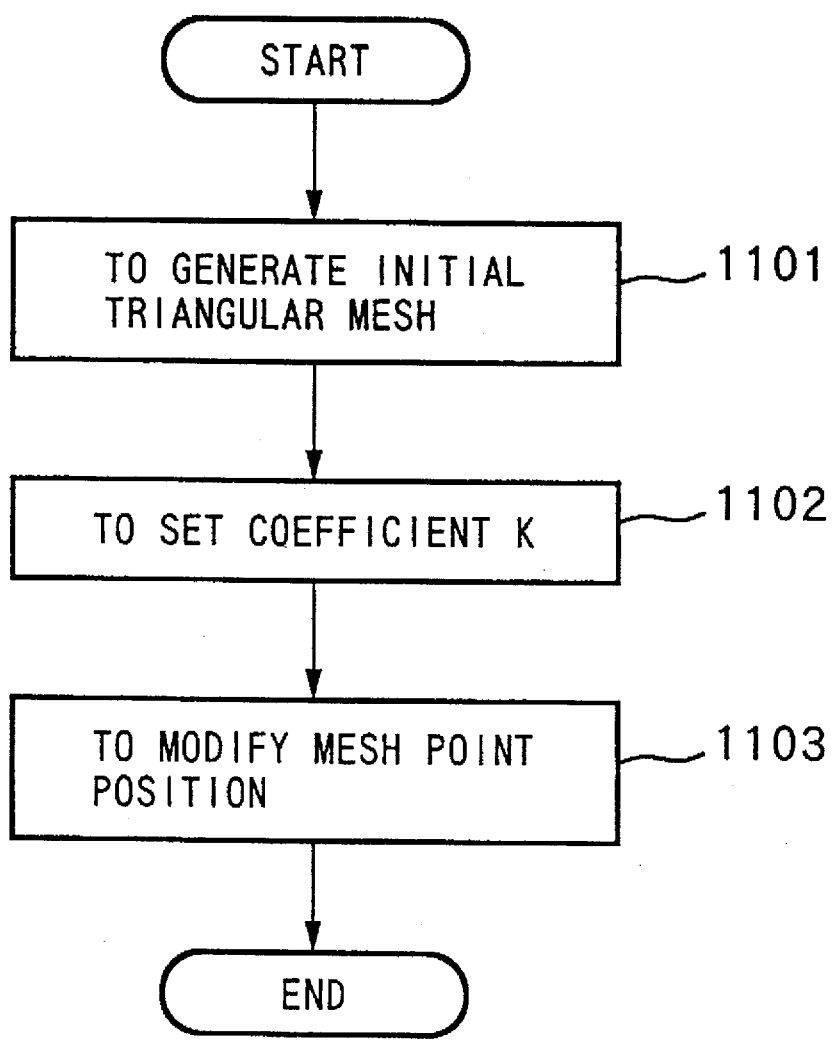
FIG. 11 is a flow chart illustrating an operation of a mesh generation unit and a mesh point position modification unit of the embodiment.

FIG. 11 is a flow chart showing operation of the mesh generation unit 60 and the mesh point position modification unit 70 of the present embodiment.

First, the mesh generation unit 60 generates an initial triangular mesh on a semiconductor device to be simulated (Step 1101). The mesh point position modification unit 70 then sets, for every mesh branch, a coefficient $k_{ij}$, which is determined according to a difference between impurity concentrations of grouped mesh points [i,j] and (j≠i) connected by a mesh branch in question (Step 1102). Then, assuming that each mesh branch is a spring using $k_{ij}$ set in Step 1102 as a spring constant, the mesh point position modification unit 70 modifies a position $(x_i, y_j)$ of each mesh point such that the spring model in question can satisfy static equilibrium conditions expressed by the following equations (Step 1103).

$$\Sigma k_{ij}(x_i-x_j)=0$$

$$\Sigma k_{ij}(y_i-y_j)=0$$

Various relationships between the above spring constant and impurity concentration difference can be defined according to components of materials forming a semiconductor device, including impurities etc. For example, the definition as expressed by the following equation is applicable.

$$k_{ij}=a|\sin h^{-1}\{(N_{Di}-N_{Ai})/c\}-\sin h^{-1}\{(N_{Dj}-N_{Aj})/c\}|+b$$

In the above equation, $N_{Di}$ and $N_{Ai}$ denote donor and acceptor concentrations of a mesh point i, respectively, and a, b and c are appropriate constants.

Figure 12:
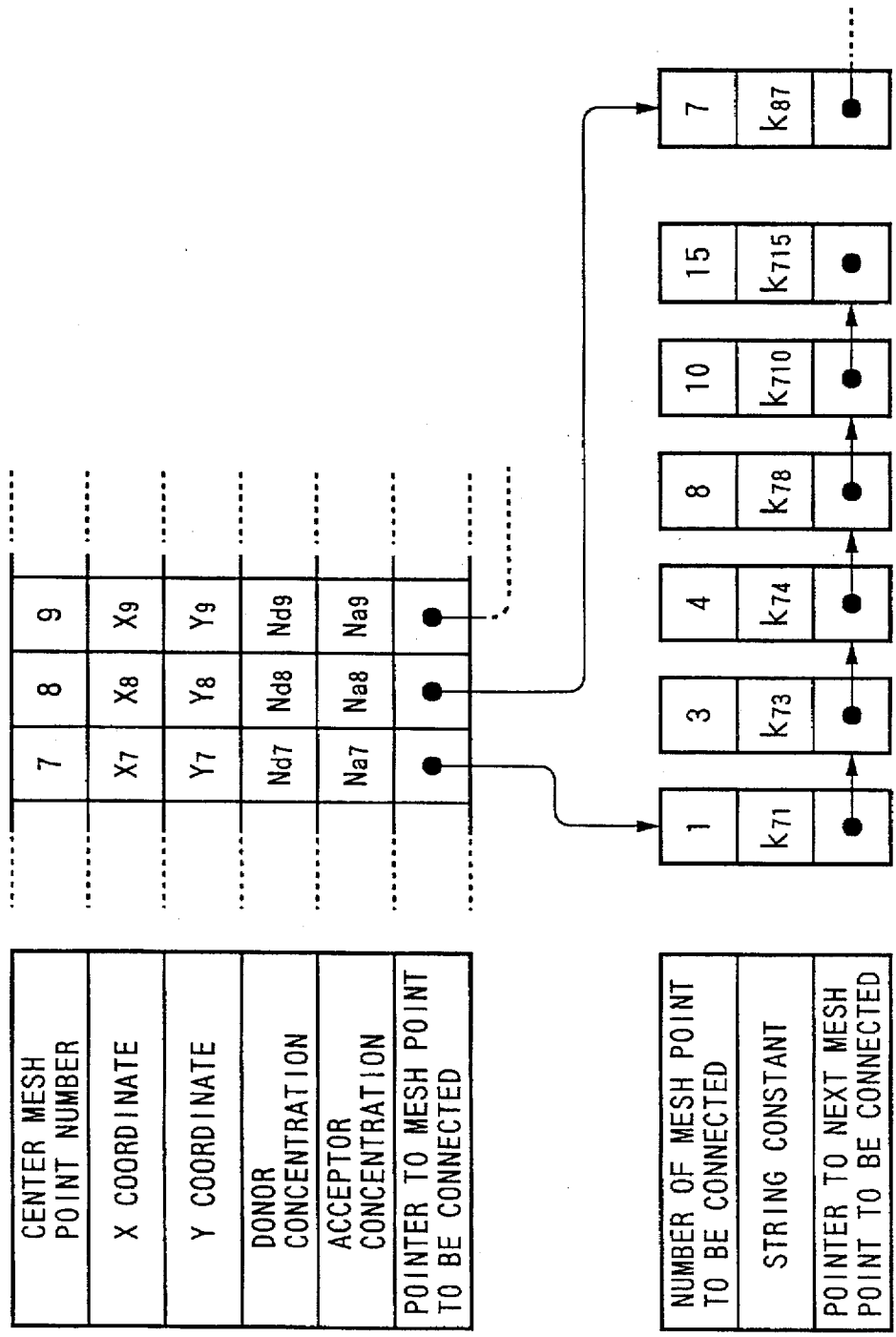
FIG. 12 is a diagram showing a data structure for implementing the embodiment.

FIG. 12 is a diagram showing one example of a data structure for implementing position modification of mesh points according to the present embodiment by using a computer. Data necessary for implementing a spring model regarding mesh branches by using a computer are coordinates and impurity concentrations of each mesh point, the number of neighboring mesh points connected to the mesh point by mesh branches and spring constants between the points. The coordinates and impurity concentrations of mesh points are stored in an array using mesh point numbers as keys. The surrounding mesh points are sequentially connected by a pointer and its first address is stored in a mesh point information array.

With reference to FIG. 12, a specific example of these data will be described. A mesh point 7 in the figure has coordinates denoted as $(x_7, y_7)$, a donor concentration as $N_{d7}$ and an acceptor concentration as $N_{a7}$. The mesh point 7 is connected to its neighboring mesh points, 1, 3, 4, 8, 10 and 15 whose spring constants are $k_{71}$, $k_{73}$, $k_{74}$, $k_{78}$, $k_{710}$ and $k_{715}$, respectively.

Figure 13:
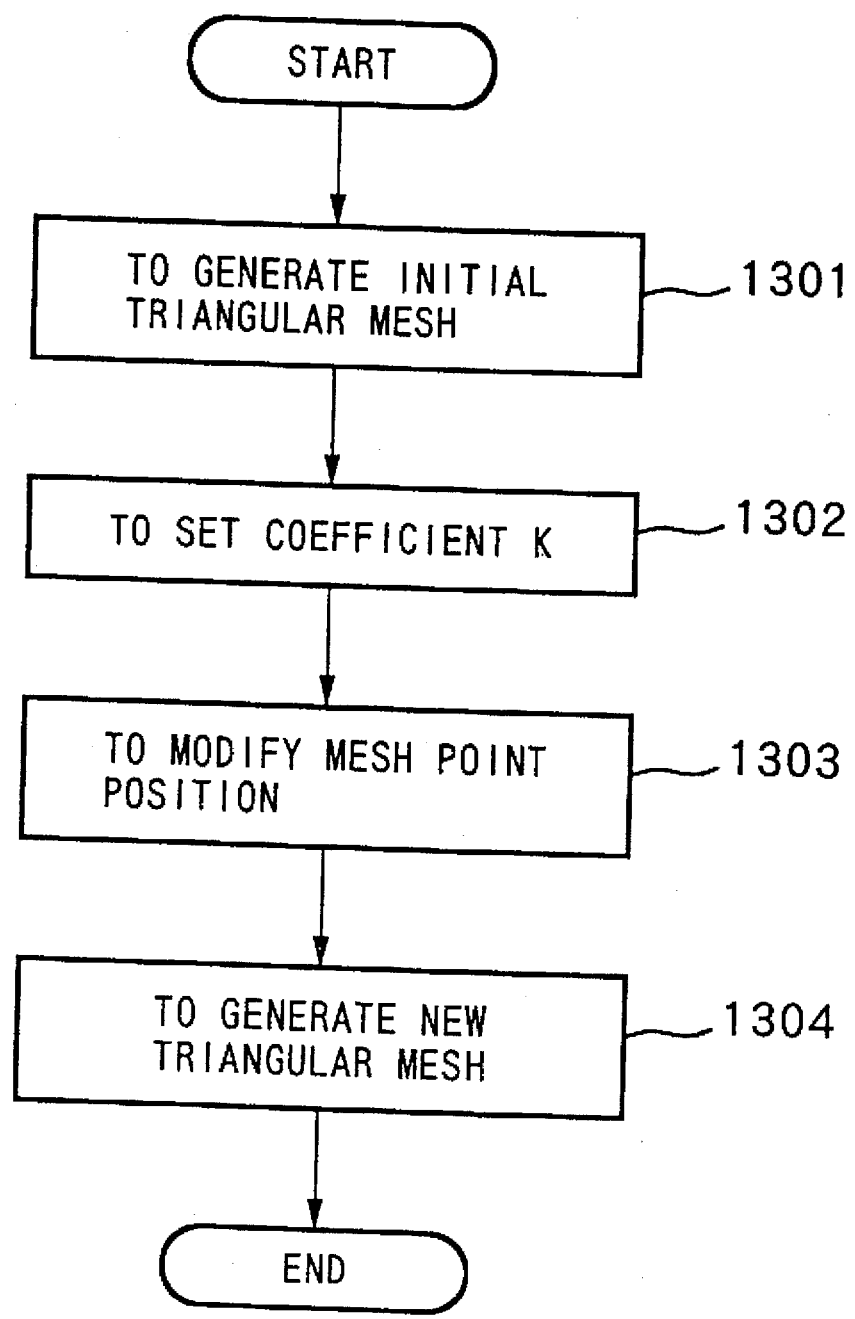
FIG. 13 is a flow chart illustrating an operation of a mesh generation unit and a mesh point position modification unit of a device simulator according to a fourth embodiment of the present invention.

FIG. 13 is a flow chart showing operation of the mesh generation unit 60 and the mesh point position modification unit 70 according to a fourth embodiment of the present invention.

In FIG. 13, generation of initial triangular meshes (Step 1301), setting of a coefficient $k_{ij}$ for each mesh branch according to an impurity concentration difference between mesh points (Step 1302) and modification of each mesh point position $(x_i, y_j)$ to meet the above-described equation of static equilibrium conditions by assuming each mesh branch to be a spring (Step 1301) are the same as those of Steps 1101 to 1103 shown in FIG. 11.

In this embodiment, after modifying the position of each mesh point in Step 1303, a new triangular mesh is created by newly connecting mesh branches corresponding to mesh points whose positions are modified (Step 1304). When the position of a mesh point is modified in Steps 1302 and 1303, there occurs formation of an extremely obtuse triangle among triangular meshes deformed as a result of the modification of the mesh points. Such an obtuse triangle, which may cause reduction of simulation precision, should be eliminated by the present processing.

Figure 14:
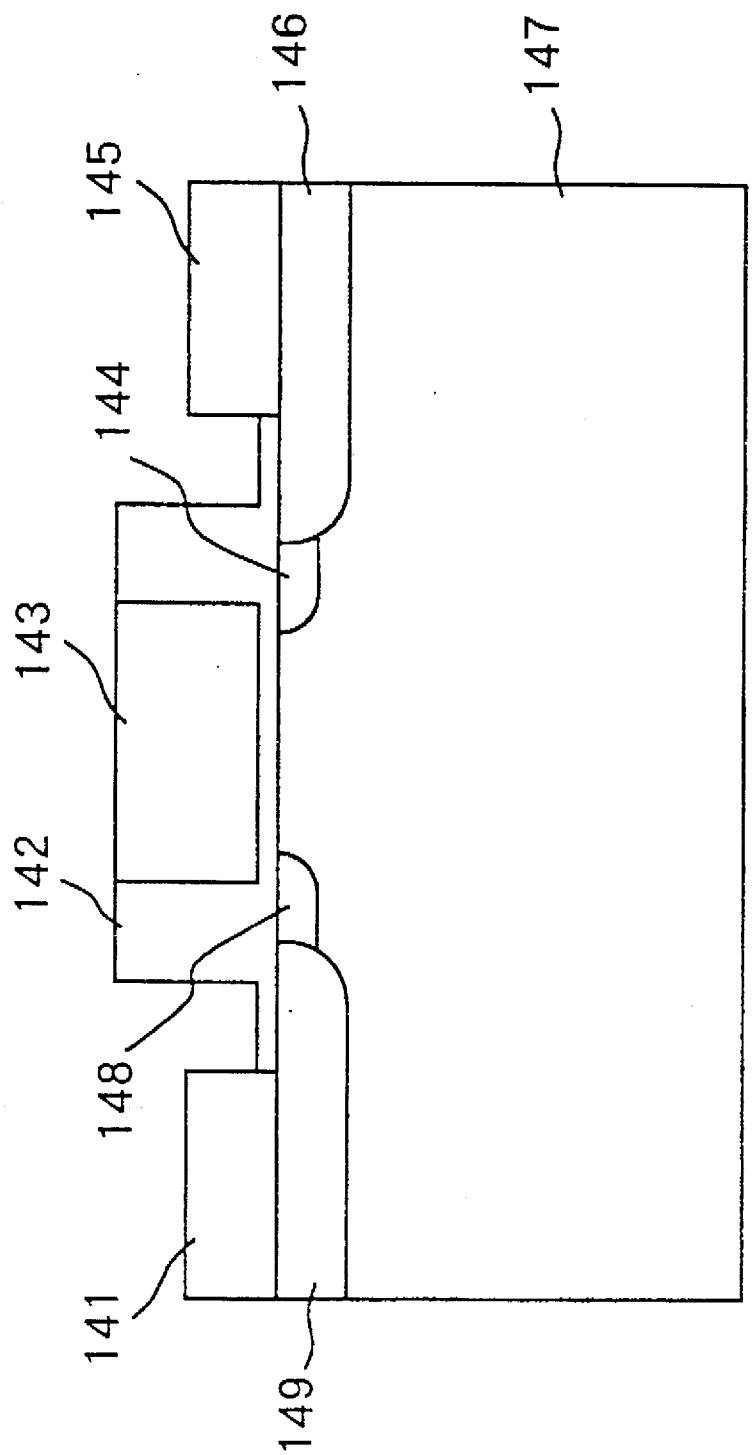
FIG. 14 is a diagram showing a example of an MOSFET arrangement according to the present invention.
Figure 15:
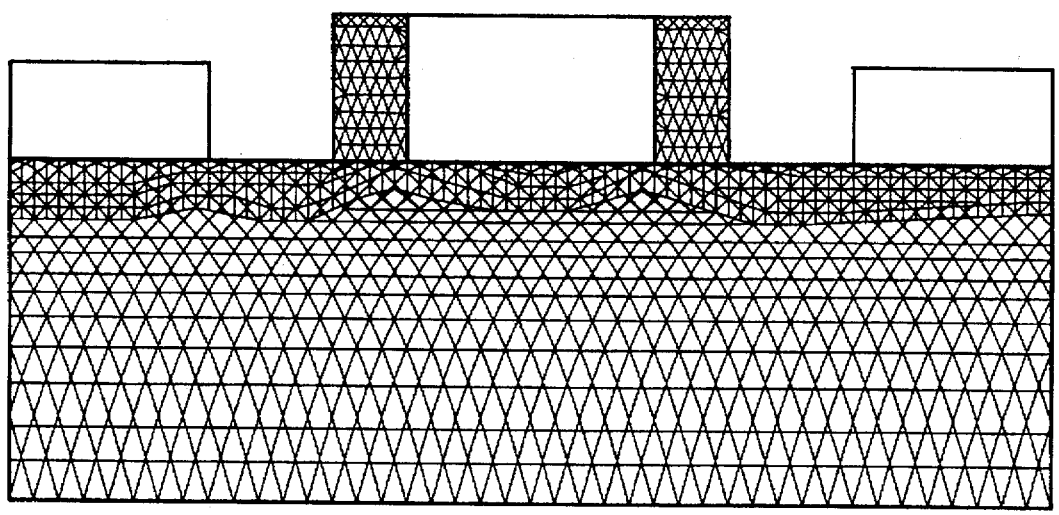
FIG. 15 is a diagram showing a state of a MOSFET on which meshes are generated by applying the present invention.

FIG. 14 is a diagram schematically showing a structure of an MOSFET to be simulated and its impurity distribution. As can been seen in the figure, the MOSFET is composed of a source electrode 141, an oxide film 142, a gate electrode 143, a drain LDD diffusion layer 144, a drain electrode 145, a drain diffusion layer 146, a substrate 147, a source LDD diffusion layer 148 and a source diffusion layer 149. Results of the simulation of the MOSFET according to the present embodiment are shown in FIG. 15. As is clear from the comparison between FIGS. 14 and 15, the vicinity of a PN junction plane between the source and drain diffusion layers 149 and 146 and the substrate 147 has dense meshes because of larger spring constants.

Figure 16:
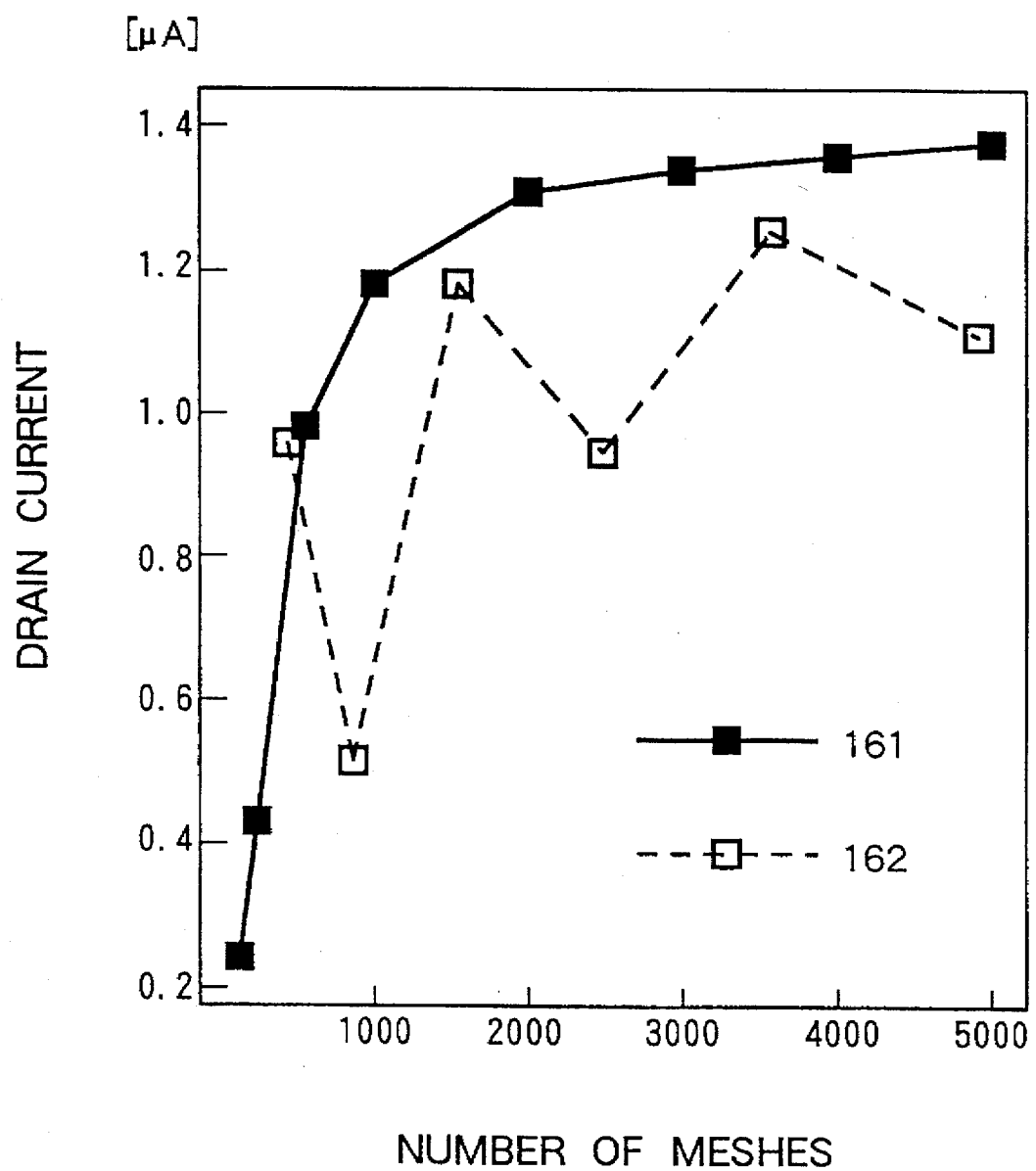
FIG. 16 is a diagram showing simulation results obtained by and without applying the present invention for comparison.
Figure 17:
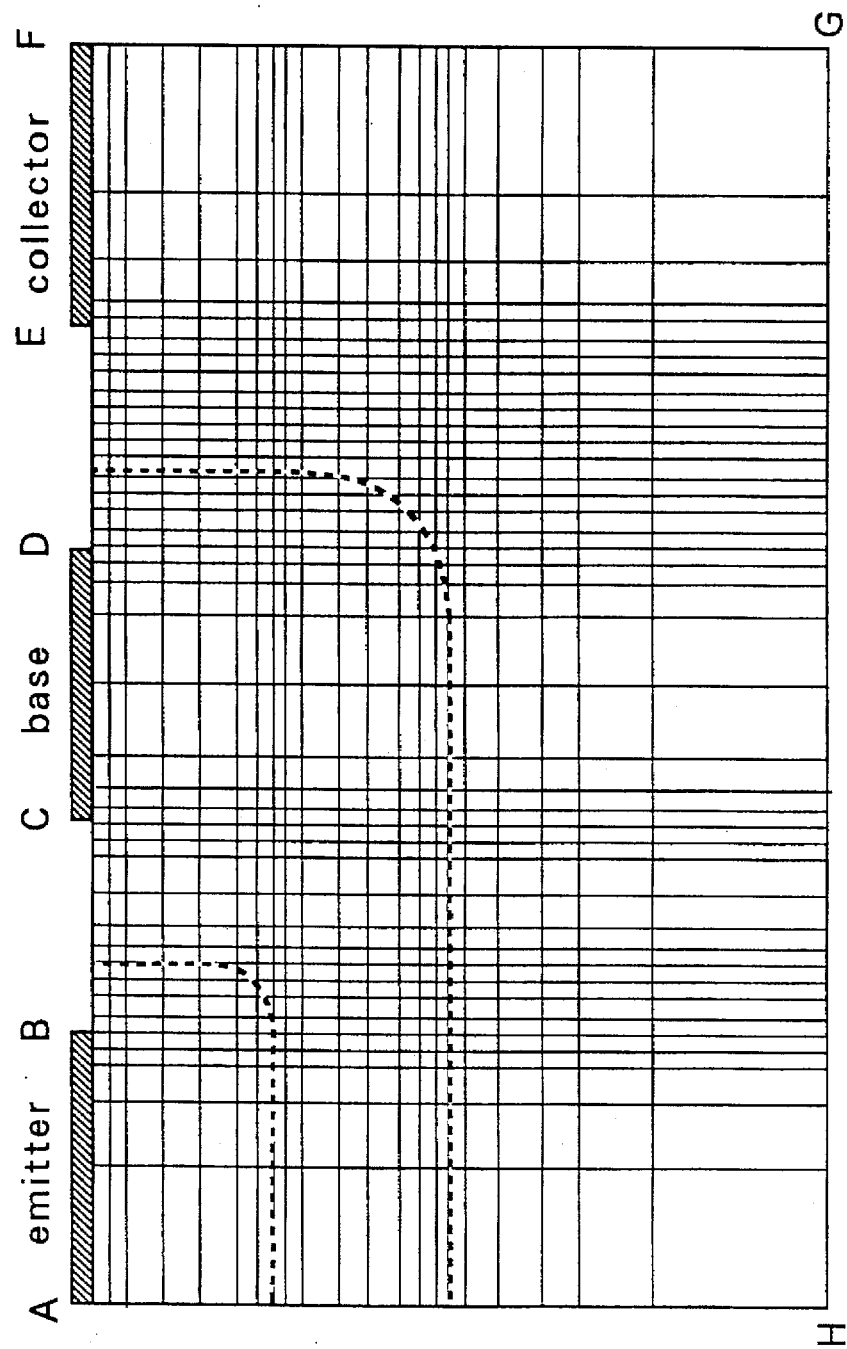
FIG. 17 is a diagram showing a state of a semiconductor device on which orthogonal meshes are generated by a conventional device simulator.
Figure 18:
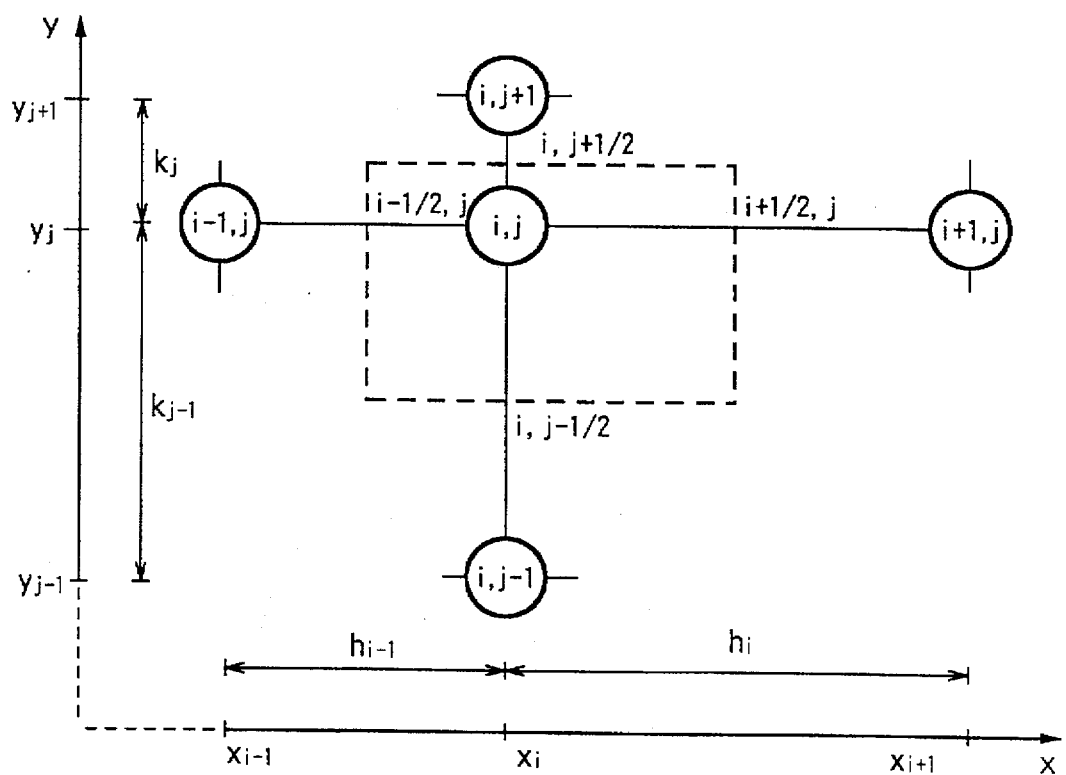
FIG. 18 is a diagram conceptually illustrating a state of the vicinity of one mesh point in an orthogonal mesh.
Figure 19:
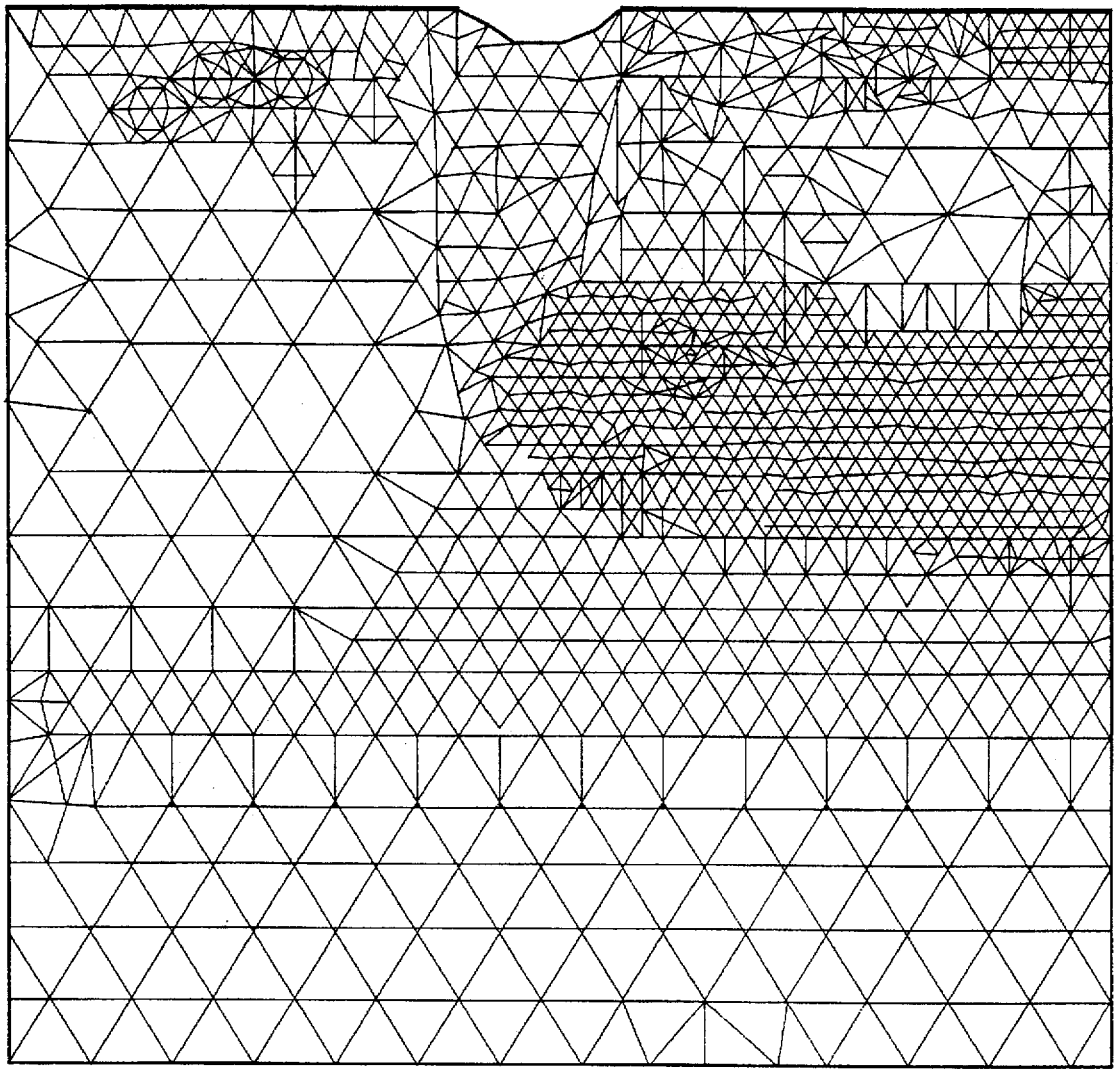
FIG. 19 is a diagram showing a state of a semiconductor device on which triangular meshes are generated by a conventional device simulator.
Figure 20:
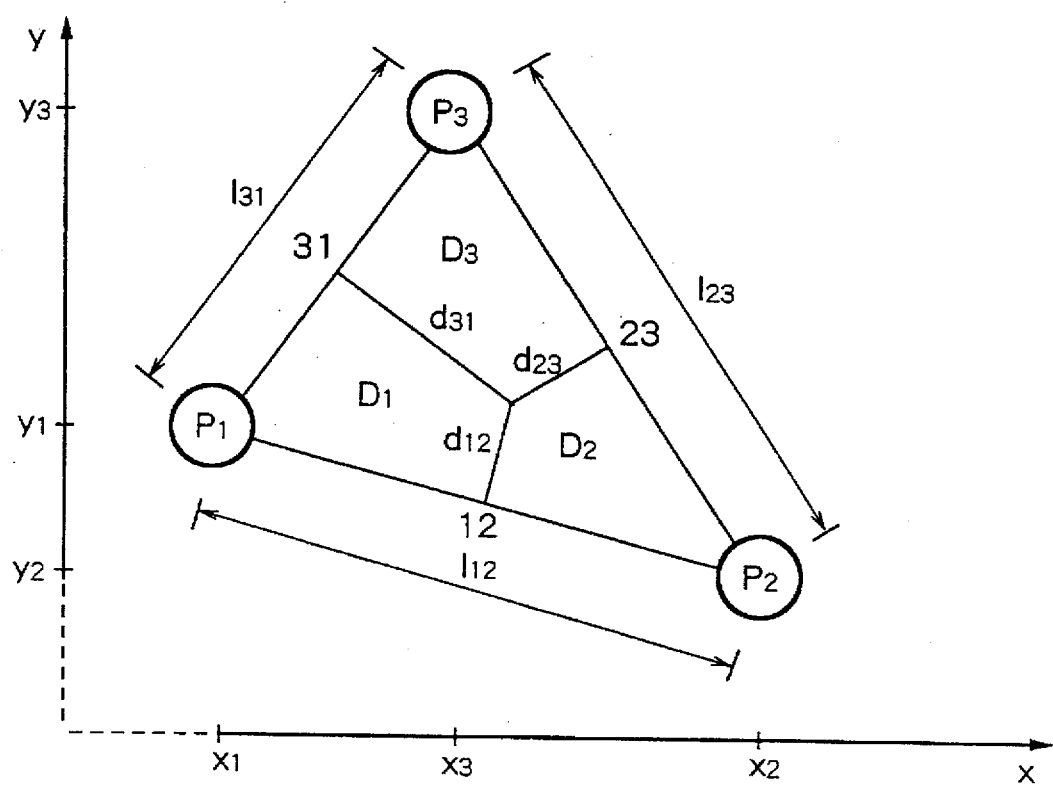
FIG. 20 is a diagram showing currents of a triangular mesh and an integration method thereof.

FIG. 16 is a diagram showing results of a comparison between a drain current in a weak inversion area of an MOSFET obtained when triangular meshes are created by applying the present embodiment and a drain current of an MOSFET obtained when uniform triangular meshes are created with the number of mesh points fixed without applying the present embodiment. In the figure, a characteristic diagram 161 represents a drain current obtained when applying the present embodiment, while a characteristic diagram 162 represents a drain current obtained when the present embodiment is not applied. As is clear from FIG. 16, when uniform meshes are used without applying the present embodiment, convergence of a current value is slow with an increase of the number of meshes and its behavior is oscillatory, while in the case of application of the present embodiment a current value converges rapidly and smoothly as the number of meshes increases. The meshes generated by applying the present embodiment are therefore more highly adaptive than uniform meshes.

As described in the foregoing, the present invention enables generation of meshes with higher adaptiveness as compared with uniform meshes of the same number. The present invention accordingly has an advantage of generating more highly adaptive meshes for semiconductor device simulation while holding the meshes to a fixed number.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which can be embodied within a scope encompassed and equivalents thereof with respect to the features set out in the appended claims.

What is claimed is:

1. A device simulator comprising:
   a boundary protection layer generating means for generating a boundary protection layer in a node based model, said boundary protection layer comprising a layer of nodes having a mesh connection without parasitic resistance in the vicinity of a node boundary representing an interface between different components of a semiconductor device;
   mesh point allocating means for allocating mesh points apart from said node boundary by a predetermined reference distance;
   and triangular mesh generating means for generating triangular meshes by connecting said mesh points.

2. The device simulator according to claim 1, wherein said boundary protection layer generating means generates a boundary protection layer including traingular meshes each having a mesh branch parallel to said node boundary.

3. The device simulator according to claim 1, further comprising checking means for checking whether a boundary protection layer with respect to a generated triangular mesh is destroyed or not, wherein when said checking means detects a destroyed part of a boundary protection layer, said boundary protection layer generating means modifies the destroyed part and re-generates a boundary protection layer.

4. The mesh generating method comprising the steps of:
   generating a boundary protection layer in a node based model, said boundary protection layer comprising a layer of nodes having a mesh connection without parasitic resistance in the vicinity of a node boundary representing an interface between different components of a semiconductor device whose electrical characteristics are to be simulated by using a computer;
   allocating mesh points apart from said boundary protection layer by a predetermined reference distance; and
   generating triangular meshes by connecting said mesh points.

5. The mesh generating method according to claim 4, wherein said step of generating a boundary protection layer comprises the steps of:

generating mesh points on a boundary line segment;

generating a predetermined number of mesh points, at predetermined intervals, from said mesh points generated on the boundary line segment other than those at vertexes of angles in a direction vertical to the boundary line segment;

generating a predetermined number of mesh points, at predetermined intervals, from said mesh point located at a vertex of an angle whose internal angle is less than 180°, among those generated on the boundary line segment, in a direction of a bisector of the angle;

generating, at predetermined intervals, a predetermined number of mesh points form said mesh point located at a vertex of an angle whose internal angle is more than 180°, among those generated on the boundary line segment, in directions vertical to two boundary line segments forming the angle and a direction bisecting the angle between the two line segments by a predetermined angle; and generating an orthogonal mesh by connecting the mesh points generated in each step by mesh branches including line segments vertical and parallel to said boundary line segment.

6. The mesh generating method according to claim 4, further comprising the steps of:

checking whether a boundary protection layer with respect to a generated triangular mesh is destroyed or not; and when a destroyed part is detected in said boundary protection layer in said step of checking whether said boundary protection layer is destroyed, modifying the destroyed part and re-generating a boundary protection layer.

7. A device simulator comprising:

a boundary protection layer generating means for generating a boundary protection layer without parasitic resistance in the vicinity of a boundary between different components of a semiconductor device whose electric characteristics are to be simulated by using a computer;

mesh point allocating means for allocating a mesh point apart from said boundary protection layer by a predetermined reference distance;

triangular mesh generating means for generating a triangular mesh by connecting said mesh points; and mesh point modifying means for modifying the position of a mesh point of said triangular mesh according to a local impurity concentration change in said semiconductor device.

8. A device simulator comprising:

mesh generating means for generating a repeated triangular arrangement of mesh points having a spacing and position representing electrical characteristics of a semiconductor device; and mesh point modifying means for modifying the position of a mesh point of said triangular mesh according to a rate of a local impurity concentration change in said semiconductor device, said mesh point modifying means having means for moving a mesh point to a position to satisfy static equilibrium conditions where each mesh branch of said triangular mesh represents a spring, with a spring coefficient set according to a rate of a local impurity concentration change in said semiconductor device.

9. A mesh generating method comprising the steps of:

generating a triangular mesh representing a semiconductor device whose electric characteristics are to be simulated by using a computer; and modifying a position of a mesh point of said triangular mesh according to a rate of a local impurity concentration change in said semiconductor device, wherein said step of modifying the position of a mesh point shifts a mesh point to a position to satisfy static equilibrium conditions where each mesh branch of said triangular mesh represents a spring with a spring coefficient set according to said rate of a local impurity concentration change in said semiconductor device.

* * * * *